United States Patent
Heo et al.

(10) Patent No.: US 10,917,120 B2
(45) Date of Patent: Feb. 9, 2021

(54) LOW-COMPLEXITY SYNDROM BASED DECODING APPARATUS AND METHOD THEREOF

(71) Applicant: KOREA UNIVERSITY RESEARCH AND BUSINESS FOUNDATION, Seoul (KR)

(72) Inventors: Jun Heo, Seoul (KR); Byung Kyu Ahn, Seoul (KR); Jong Hyun Lee, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 16/233,645

(22) Filed: Dec. 27, 2018

(65) Prior Publication Data

US 2020/0083911 A1    Mar. 12, 2020

(30) Foreign Application Priority Data

Sep. 7, 2018 (KR) .......................... 10-2018-0106785

(51) Int. Cl.
*H03M 13/29* (2006.01)
*H03M 13/11* (2006.01)

(52) U.S. Cl.
CPC ... *H03M 13/2963* (2013.01); *H03M 13/1108* (2013.01); *H03M 13/2975* (2013.01); *H03M 13/2978* (2013.01)

(58) Field of Classification Search
CPC ......... H03M 13/2963; H03M 13/1108; H03M 13/2975; H03M 13/2978
See application file for complete search history.

(56) References Cited

U.S. PATENT DOCUMENTS

| | | | | |
|---|---|---|---|---|
| 3,656,107 | A * | 4/1972 | Hsiao | H03M 13/13 714/753 |
| 3,745,525 | A * | 7/1973 | Hong | H03M 13/19 714/765 |
| 4,077,565 | A * | 3/1978 | Nibby, Jr. | G06F 11/1048 714/758 |
| 4,464,753 | A * | 8/1984 | Chen | G06F 11/1028 714/765 |
| 6,009,552 | A * | 12/1999 | Ariel | H03M 13/23 714/780 |
| 6,101,614 | A * | 8/2000 | Gonzales | G06F 11/106 714/6.1 |
| 6,182,264 | B1 * | 1/2001 | Ott | H03M 13/09 714/774 |

(Continued)

*Primary Examiner* — Guy J Lamarre
(74) *Attorney, Agent, or Firm* — Hauptman Ham, LLP

(57) ABSTRACT

The present disclosure relates to a low-complexity syndrome based decoding apparatus and method and a low-complexity syndrome based decoding apparatus includes: a hard decision unit which performs hard decision on a current input value to output a hard decision vector; a syndrome calculator which performs a syndrome operation on the hard decision vector and determines an error type of the hard decision vector based on the syndrome operation result; and a decoder which selects a predetermined decoding algorithm in accordance with the error type to perform the decoding, and the error type includes at least one of no error, a single error, and a double error.

12 Claims, 11 Drawing Sheets

(56) References Cited

U.S. PATENT DOCUMENTS

| | | | | |
|---|---|---|---|---|
| 6,463,563 | B1* | 10/2002 | Chen | G11C 29/02 |
| | | | | 714/768 |
| 6,978,415 | B1* | 12/2005 | Weng | H03M 13/15 |
| | | | | 708/492 |
| 10,243,590 | B1* | 3/2019 | Seshadri | G11C 15/00 |
| 2002/0124223 | A1* | 9/2002 | Thesling | H03M 13/2963 |
| | | | | 714/758 |
| 2006/0136800 | A1* | 6/2006 | Kawabata | G06F 11/1012 |
| | | | | 714/763 |
| 2007/0011598 | A1* | 1/2007 | Hassner | H03M 13/19 |
| | | | | 714/801 |
| 2007/0150798 | A1* | 6/2007 | Shieh | H03M 13/6502 |
| | | | | 714/785 |
| 2010/0125776 | A1* | 5/2010 | Mutchnik | H03M 13/152 |
| | | | | 714/785 |
| 2013/0061115 | A1* | 3/2013 | Imai | H03M 13/618 |
| | | | | 714/763 |
| 2017/0077963 | A1* | 3/2017 | Jung | H03M 13/6502 |
| 2017/0111061 | A1* | 4/2017 | Ish-Shalom | H03M 13/098 |
| 2019/0068219 | A1* | 2/2019 | Bhatia | G11C 29/42 |

* cited by examiner

FIG. 5

| R | -0.1 | -0.2 | -0.3 | 0.9 | 2.3 | 1.2 | 1.7 | 1.5 |
|---|---|---|---|---|---|---|---|---|
| $R^H$ | 0 | 0 | 0 | 1 | 1 | 1 | 1 | 1 |
| $D^{HDD}$ | 0 | 0 | 0 | 0 | 1 | 1 | 1 | 1 |
| $D^{ML}$ | 1 | 1 | 1 | 1 | 1 | 1 | 1 | 1 | und

LOW-COMPLEXITY SYNDROM BASED DECODING APPARATUS AND METHOD THEREOF

CROSS-REFERENCE TO RELATED APPLICATIONS

This application claims the priority of Korean Patent Application No. 10-2018-0106785 filed on Sep. 7, 2018, in the Korean Intellectual Property Office, the disclosure of which is incorporated herein by reference.

BACKGROUND

Field

The present disclosure relates to a low-complexity syndrome based decoding apparatus and a method thereof, and more particularly, to a syndrome based decoding apparatus and a method thereof which have a low complexity without causing performance degradation by applying an extended Hamming code as a component code of a block turbo code.

Description of the Related Art

A block turbo code (BTC) is decoded using a soft-in soft-out (SISO) decoding algorithm and is configured by a chase II algorithm which generates $2^p$ candidate codewords from p least reliable bits (LRBs) and then finds an optimal codeword therefrom and an extrinsic information calculating part which converts the optimal codeword to s soft output. However, according to this method, a series of processes for generating $2^p$ candidate codewords, then applying a hard input hard output (HIHO) decoding algorithm to each of the codewords, and finding an optimal codeword therefrom should be performed at all times so that the decoding complexity is relatively high.

Therefore, many studies have been conducted to reduce the complexity of the Chase-Pyndiah algorithm. As such a method, a hybrid decoding algorithm in which SISO and HIHO algorithms are combined has been introduced. According to the hybrid decoding algorithm, the SISO algorithm is used for early iterative decoding to reduce the decoding complexity and the low-complexity HIHO algorithm is applied for the remaining error correction.

However, according to the techniques of the related art, the unnecessary complex SISO algorithm is applied regardless of a reliability of an input sequence which varies according to the number of iterations or a signal to noise ratio (SNR).

RELATED ART DOCUMENT

Patent Document: Korean Unexamined Patent Application Publication No. 10-2014-0071169 (published on Jun. 11, 2014)

SUMMARY

A technical object to be achieved by the present disclosure is to provide a low-complexity syndrome based decoding apparatus and a method thereof which are capable of reducing a decoding complexity of a block turbo code (BTC) without causing the performance degradation.

Technical objects of the present disclosure are not limited to the aforementioned technical objects and other technical objects which are not mentioned will be apparently appreciated by those skilled in the art from the following description.

According to an aspect of the present disclosure, a low-complexity syndrome based decoding apparatus includes: a hard decision unit which performs hard decision on a current input value to output a hard decision vector; a syndrome calculator which performs a syndrome operation on the hard decision vector and determines an error type of the hard decision vector based on the syndrome operation result; and a decoder which selects a predetermined decoding algorithm in accordance with the error type to perform the decoding, and the error type includes at least one of no error, a single error, and a double error.

Desirably, the current input value may be a value based on at least one of a received signal value, extrinsic information at previous half iteration, and a reliability factor.

Desirably, the syndrome calculator may calculate a syndrome vector by multiplying the hard decision vector and a predetermined parity check matrix and determines at least one error type among the no error, the single error, and the double error for the hard decision vector, based on the syndrome vector.

Desirably, the decoder may include: a first decoder which performs a decoding procedure by applying a soft input soft output (SISO) decoding algorithm when the error type is no error; a second decoder which performs a decoding procedure by applying a hard input soft output (HISO) decoding algorithm or a modified SISO decoding algorithm depending on whether there is a double error in previous half iterative decoding when the error type is a single error; and a third decoder which performs a decoding procedure by applying a modified SISO decoding algorithm when the error type is a double error.

Desirably, the first decoder may select the hard decision vector as a codeword and calculate extrinsic information based on the hard decision vector.

Desirably, the second decoder may include: a double error check module which determines whether there is a double error in previous half iterative decoding; and a decoding module which performs the HISO decoding algorithm or the modified SISO decoding algorithm depending on whether there is a double error as a determination result of the double error check module.

Desirably, the decoding module may include: a first decoding module which corrects the single error through the HISO decoding algorithm before performing next iterative decoding when there is no double error; and a second decoding module which finds a position of a predetermined number of least reliable bits (LRBs) when there is a double error, uses the HISO decoding algorithm when the position of the LRB and the position of the single bit corrected by the HISO decoding are compared and the positions are the same, and uses the modified SISO decoding algorithm when the two positions are not the same.

Desirably, the modified SISO decoding algorithm generates $2^P$ candidate codewords by the positions of P (p is a natural number) LRBs and eliminates duplicated or unnecessary codewords among the candidate codewords, and then determines a maximum likelihood codeword by calculating the least Euclidean distance.

According to one aspect of the present disclosure, a low-complexity syndrome based decoding method by a decoding apparatus, includes: performing hard decision on a current input value to output a hard decision vector; performing a syndrome operation on the hard decision vector and determining an error type of the hard decision vector based on the syndrome operation result; and selecting a predetermined decoding algorithm in accordance with the error type to perform the decoding, the error type includes at least one of no error, a single error, and a double error.

Desirably, the determining of an error type includes: calculating a syndrome vector by multiplying the hard decision vector and a predetermined parity check matrix; and determining at least one error type among the no error, the single error, and the double error for the hard decision vector, based on the syndrome vector.

Desirably, in the performing of the decoding, a decoding procedure may be performed by applying a soft input soft output (SISO) decoding algorithm when the error type is no error.

Desirably, the performing of the decoding may include: determining whether there is a double error in previous half iterative decoding when the error type is the single error; and correcting the single error through the HISO decoding algorithm before performing next iterative decoding when there is no double error; and finding a position of a predetermined number of least reliable bits (LRBs) when there is a double error, using the HISO decoding algorithm when the position of the LRB and the position of the single bit corrected by the HISO decoding are compared and the positions are the same, and using the modified SISO decoding algorithm when the two positions are not the same.

Desirably, in the performing of the decoding, a decoding procedure may be performed by applying a modified SISO decoding algorithm when the error type is a double error.

According to the present disclosure, a syndrome characteristic is used by applying an extended Hamming code as a component code of a block turbo code to reduce the decoding complexity without causing the performance degradation.

The effects of the present disclosure are not limited to the technical effects mentioned above, and other effects which are not mentioned can be clearly understood by those skilled in the art from the following description.

BRIEF DESCRIPTION OF THE DRAWINGS

The above and other aspects, features and other advantages of the present disclosure will be more clearly understood from the following detailed description taken in conjunction with the accompanying drawings, in which:

FIG. 5 is an exemplary view for explaining an example where $D^{ML}$ and $D^{HDD}$ according to an exemplary embodiment of the present disclosure do not match;

DETAILED DESCRIPTION OF THE EMBODIMENT

Figure 1:
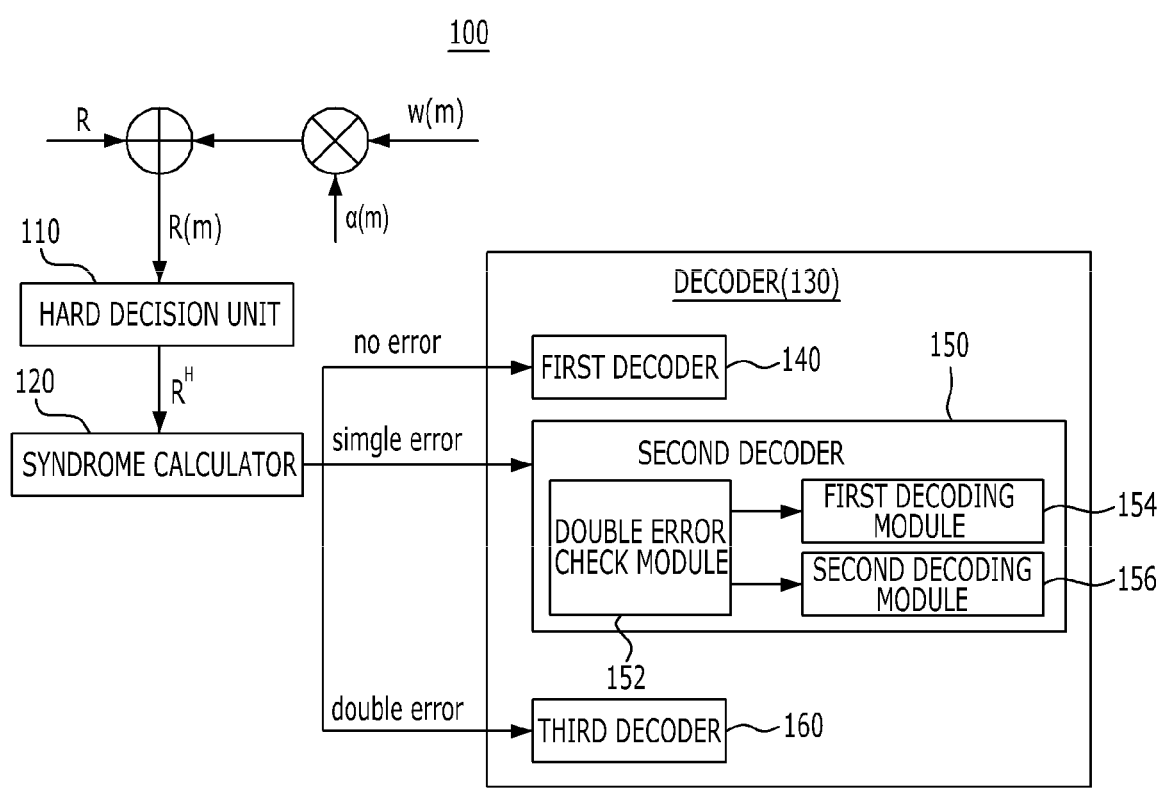
FIGS. 1 and 2 are views for explaining a low-complexity syndrome based decoding apparatus according to an exemplary embodiment of the present disclosure.

Hereinafter, exemplary embodiments of the present disclosure will be described more fully with reference to the accompanying drawings for those skilled in the art to easily implement the present invention. As those skilled in the art would realize, the described embodiments may be modified in various different ways, all without departing from the spirit or scope of the present invention and the present invention is not limited to the embodiments described herein.

In order to clearly illustrate the present invention, parts not related to the description are omitted. Like reference numerals designate like elements throughout the specification. Therefore, reference numerals which are used in previous drawings may be used for another drawing.

The size and thickness of the components shown the drawings are optionally determined for better understanding and ease of description, and the present invention is not limited to the examples shown in the drawings. In the drawings, thicknesses of several layers and regions are enlarged for clear expressions.

The present disclosure proposes three efficient schemes that can reduce a decoding complexity without causing performance loss as compared with a decoding scheme of the related art. To achieve this, the present disclosure applies an error detection property of a syndrome of a (n,k,d) extended Hamming code which is used as a BTC component code. Here, n is a codeword length, k is an information length, and d is a minimum Hamming distance. By adding a parity bit to a codeword in the Hamming code, detection of double errors and correction of signal errors become possible. This error detection property allows detecting a hard decision input vector $R^H$ as either having no error, single error, or double error, depending on a result of a syndrome operation.

Therefore, the present disclosure selects and uses one of an SISO decoding algorithm and an HISO decoding algorism based on a result of estimating the number of errors of the hard decision vector $R^H$ through the syndrome operation. If a previous codeword $C_t$ is transmitted to a decoding apparatus through an additive white Gaussian noise (AWGN) channel, the received codeword is assumed to be R and the hard decision vector $R^H$ is assumed to be a hard decision value of R. Next, a syndrome value of the hard decision vector $R^H$ is determined using a parity check matrix H of the extended Hamming code. The decoding process is performed by classifying a case with no error, a case having a single error, and a case having a double error, based on the syndrome detection result.

Hereinafter, a low-complexity syndrome based decoding apparatus and method according to an exemplary embodiment of the present disclosure will be described in more detail with reference to accompanying drawings.

Figure 2:
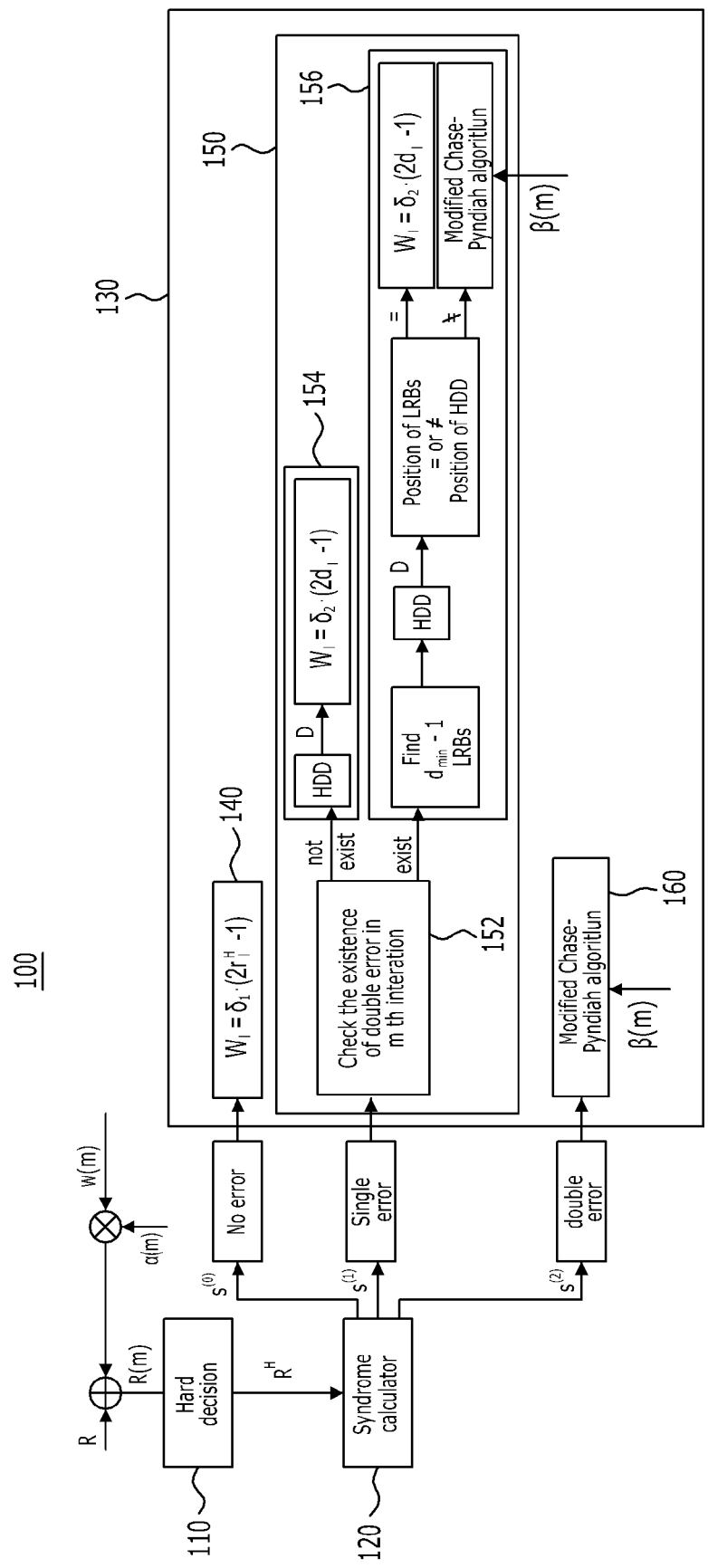

FIGS. 1 and 2 are views for explaining a low-complexity syndrome based decoding apparatus according to an exemplary embodiment of the present disclosure.

Referring to FIGS. 1 and 2, a low-complexity syndrome based decoding apparatus 100 according to an exemplary embodiment of the present disclosure includes a hard decision unit 110, a syndrome calculator 120, and a decoder 130.

The hard decision unit 110 performs hard decision on a current input value to output a hard decision vector. In this case, the current input value may be a value based on at least one of a received signal value, extrinsic information at the time of previous half iteration, and a reliability factor and the received signal value may refer to received signal information which passes through a channel to be input to the decoding apparatus 100.

Therefore, the hard decision unit 110 receives a value obtained by multiplying the extrinsic information at the time of previous half iteration and the reliability factor to the received signal value and performs the hard decision on the input value to output a hard decision vector. In this case, a current input value $R_x(m)$ which is input to the hard decision unit 110 at m-th decoding is expressed by the following Equation 1.

$$R(m) = [R] + \alpha(m-1) \times W(m-1) \quad \text{[Equation 1]}$$

In this case, m is an order of iterative decoding, R(m) is an m-th input value, [R] is a received signal value, $\alpha(m-1)$ is an m−1-th reliability weight, W(m−1) is m−1-th extrinsic information.

For example, the hard decision unit 110 performs hard decision to determine to be 1 if an input value is larger than 0 and to be 0 if the input value is smaller than 0 to obtain a hard decision vector $R^H = (r_1^H, r_2^H, \ldots, r_n^H)$.

The syndrome calculator 120 performs syndrome computation on the hard decision vector and determines an error type of the hard decision vector based on the syndrome computing result. That is, the syndrome calculator 120 calculates a syndrome vector by multiplying the hard decision vector $R^H$ and a predetermined parity check matrix H and determines at least one error type of no error, single errors, and double errors, for the hard decision vector, based on the syndrome vector. In this case, the syndrome calculator 120 may determine the error type based on an error detection capability of the extended Hamming code.

The decoder 130 selects a decoding algorithm which is set in advance in accordance with an error type determined by the syndrome calculator 120 to perform decoding. In this case, the error type may include no error, a single error, and a double error.

Therefore, the decoder 130 includes a first decoder 140 which performs decoding by applying a predetermined decoding algorithm when the error type is no error, a second decoder 150 which performs decoding by applying a predetermined decoding algorithm when the error type is a single error, and a third decoder 160 which performs decoding by applying a predetermined decoding algorithm when the error type is a double error. In this case, the first decoder 140 applies an SISO decoding algorithm, the second decoder 150 applies an HISO decoding algorithm or a modified SISO decoding algorithm depending on whether there is a double error in a previous half iterative decoding process, and the third decoder 160 applies a modified SISO decoding algorithm.

Specifically, when it is determined that there is no error, the first decoder 140 selects a hard decision vector as a codeword and calculates extrinsic information based on the hard decision vector. When the syndrome indicates no error, the hard decision vector $R^H$ does not have an error, so that it is selected as a codeword as it is and the extrinsic information $w_j$ of a j-th bit is calculated using the following Equation 2.

$$w_j = \gamma_1 \cdot (2r_j^H - 1) \quad \text{[Equation 2]}$$

Here, $\gamma_1$ is a reliability factor and $r_j^H$ is a j-th bit value of $R^H$.

When the hard decision vector $R^H$ of the received signal R has a zero syndrome, the decoding is performed in the same order as that in the syndrome based algorithm of the related art. In this process, in order to reduce the complexity, when the syndrome is "0", the ML codeword which is a result of the Chase II algorithm is replaced by the hard decision vector $R^H$. This is because a codeword having the smallest Euclidean distance among $2^P$ candidate codewords is always the hard decision vector $R^H$. From this, the decoding complexity may be reduced in proportion to the rate of the zero syndrome. Therefore, it is assumed that the hard decision vector $R^H$ does not have an error and the extrinsic information of the j-th bit position may be calculated by Equation 2.

In this case, because the $2^P$ candidate codewords cannot be obtained owing to the omission of the Chase II algorithm, the extrinsic information may be calculated using Equation 2. However, the reliability factor γ1 used in Equation 2 is determined to be greater than the reliability factor β of the related art, but a value determined as an optimum factor has not yet been clarified. Therefore, the first decoder 140 may set twice the value of β which archives the best performance by performing repeated experiments with various factor values as $\gamma_1$.

When the error type is determined as a single error, the second decoder 150 determines whether there is a double error in previous half iterative decoding and applies a different decoding scheme depending on the determination result. That is, the second decoder 150 sequentially applies two conditions which may classify input vectors detected as having a single error into an input vector with a single error and an input vector with a double error and respectively applies the SISO algorithm and the HISO algorithm depending on whether the conditions are satisfied. Therefore, the number of uses of the SISO algorithm may be reduced without performance loss.

Hereinafter, an example determined as a single error will be described in detail.

In the decoding algorithm of the related art, if the HDD is applied up to [(d−1)/2] errors which are the maximum error correction capability of the component code which is applied to each column or row of the BTC, the decoding complexity may be reduced, but the performance loss occurs. Likewise, in the present disclosure having the extended Hamming code as a component code, the same performance degradation problem is noted when the HDD is applied up to a 1-bit error which is the maximum error correction capability. This occurs in some cases in which the hard decision vector $R^H$ detected as having a 1-bit error contains more errors.

Figure 3:
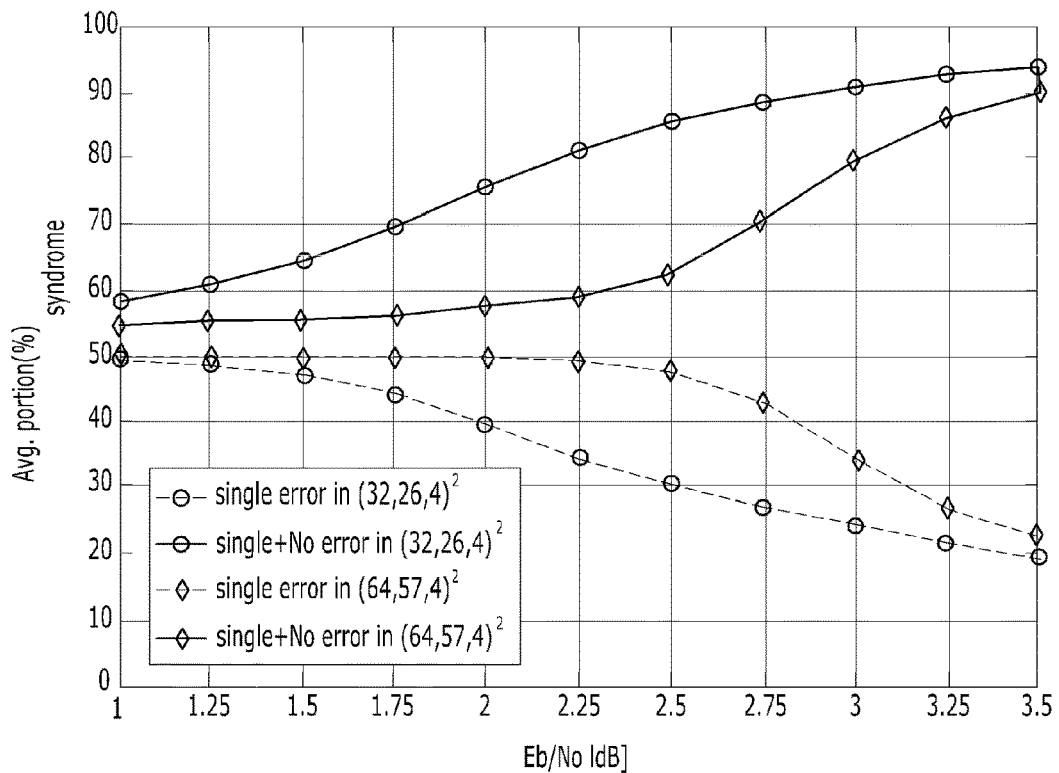
FIG. 3 is a graph for explaining a distribution of input information per syndrome after four iterative decoding processes according to an exemplary embodiment of the present disclosure.

However, most of the hard decision vector $R^H$ has a one-bit error and a ratio of being detected as having a single error among all the input vectors accounts to as much as the ratio of zero syndrome as seen from FIG. 3 which illustrates distribution per syndrome in four iterations. Therefore, in order to reduce the complexity without performance loss, cases in which the hard decision vector $R^H$ contains a single error are classified by applying two conditions and the decoding process is performed based thereon.

Figure 4:
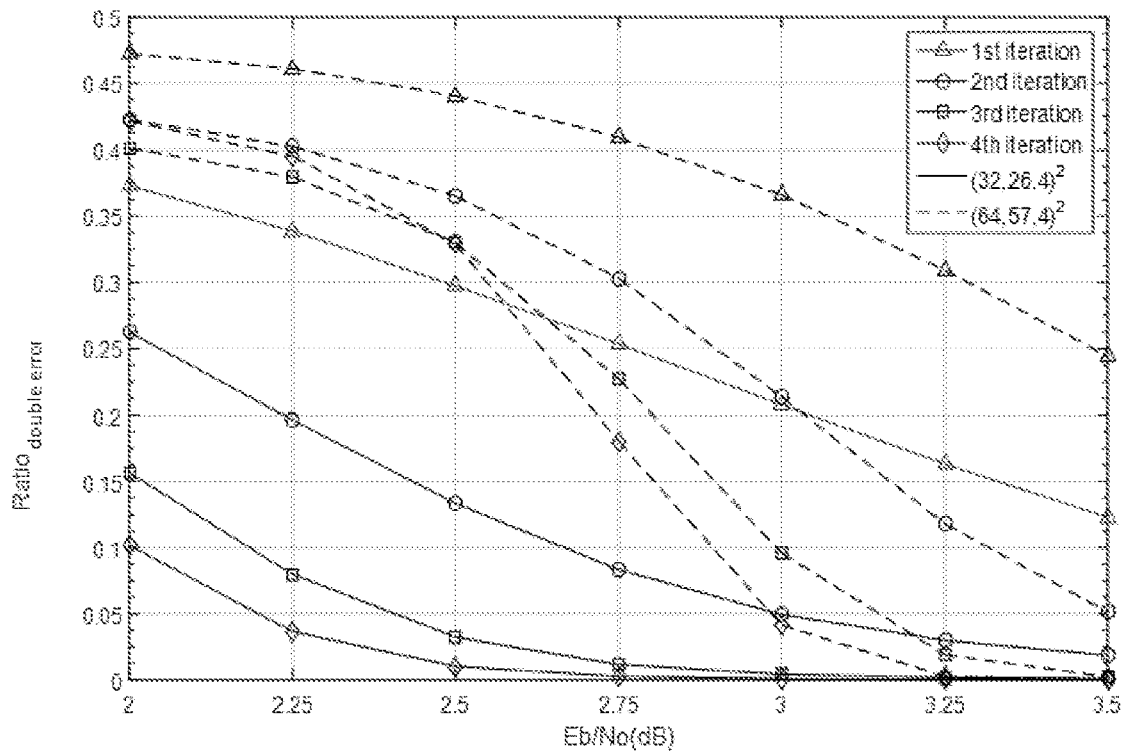
FIG. 4 is a graph for explaining a ratio of syndromes with double errors for input vectors in an m-th iteration according to an exemplary embodiment of the present disclosure.

FIG. 4 illustrates a ratio of detected vectors with double errors for each of 32 and 64 row (column) input vectors in each iteration according to the change of the SNR in a decoder of $(32,26,4)^2$ and $(64,57,4)^2$ BTC. In the iterative decoding process, the number of residual errors is gradually reduced as the number of iterations increases so that the ratio of detected vectors with double errors also gradually decreases and eventually reaches zero. When it is assumed that the number of half iterations at this time is m, it means that there is no possibility that an error occurs in the hard decision vector $R^H$ in the decoding process from m+1-th half iteration. However, when the syndrome of the hard decision vector $R^H$ is detected as having a single error, a possibility that the hard decision vector $R^H$ has one bit error is also considerably high. Therefore, an optimal codeword D may be found with only the HDD of the hard decision vector $R^H$ by applying the following condition 1.

Condition 1. When the syndrome is not detected with a double error from the hard decision vector $R^H$ of each row (column) in the m-th half iteration and the hard decision vector $R^H$ is detected with the single error in an m+1-th half iteration, the existing Chase-Pyndiah decoding algorithm may be replaced with the HDD based HISO algorithm.

However, in other cases, even though the syndrome is detected with a single error, a possibility that the hard decision vector $R^H$ has multiple bit errors is much higher than that of belonging to Condition 1. Therefore, the hard decision vector $R^H$ included in this case is corrected only by the HDD based HSIO, the performance loss may occur. In order to solve this problem, the following Condition 2 is applied.

Condition 2. If there is a hard decision vector $R^H$ detected with double errors in the m-th half iteration and the hard decision vector $R^H$ is detected with a single error in the m+1-th half iteration, it is checked whether one of positions of d−1 LRBs and the position of the bit corrected by the HDD match. If there is no match, the Chase-Pyndiah algorithm is applied and if there is a match, the HDD based HISO algorithm is applied.

In Condition 2, after generating a reliability vector $R_{rel}=(|r_1|, |r_2|, \ldots, |r_n|)$ from the input vector $R=(r_1, r_2, \ldots, r_n)$, a process of finding a position of a d−1 bit having the least reliability among total n bits is necessary. This is because when the HDD is performed in an LRB position with the highest possibility of error occurrence, a probability that the error correction of the bits of the hard decision vector $R^H$ is correctly performed is guaranteed. In addition, as the number of the LRB positions which will be compared with the position of the bits corrected through the HDD is increased, the application rate of the HDD based HISO algorithm is increased. However, the possibility of error correction in the HDD increases as the number of LRBs increases. The most important condition to solve this problem is to set the number of LRBs to be compared with the position of the bit corrected in the HDD to be d−1 for the purpose of improving the decoding complexity without performance loss. The reason why the number of LRBs to be compared with the position of the bits corrected by the HDD is set to be d−1 is to prevent the performance loss due to wrong decision during the process of calculating an optimal codeword D by replacing the Chase II algorithm with the HDD based HISO algorithm. To do this, it is most important that the codewords D before and after replacing this process are identical. In order to guarantee this, the number of LRBs is set to be d−1 and the verification procedure will be described below.

First, it is assumed that a codeword obtained by the HDD of the hard decision vector $R^H$ is $D^{HDD}$ and an ML codeword with the smallest Euclidean distance obtained by applying $R^H$ to the Chase II algorithm is $D^{ML}$. If a j-th bit error of $R^H$ is corrected through the HDD, a difference between the Euclidean distances for $D^{HDD}$ and $R^H$ may be calculated by the following Equation 3.

$$(r_j-c_j)^2-(r_j-r_j^H)^2=4|r_j| \qquad \text{[Equation 3]}$$

Here, $c_j$ denotes a bit corrected through HDD and $r_j^H$ denotes a j-th bit of $R^H$.

The $D^{HDD}$ and $D^{ML}$ may be or may not be the same depending on the SNR value or the number of iterations. When $D^{HDD}$ and $D^{ML}$ are the same, the difference of the Euclidean distances of $R^H$ and $D^{ML}$ from R is expressed by the following Equation 3.

However, in some cases, $D^{HDD}$ and $D^{ML}$ are different. This occurs when one codeword among the remaining candidate codewords other than $D^{HDD}$ has the least Euclidean distance. In this case, the difference between the Euclidean distances of $D^{ML}$ and $R^H$ is caused by the existence of more than d−1 bits with different values therebetween. This occurs because the difference of Hamming weights between $D^{HDD}$ and $D^{ML}$ is at least d. Based on this, it is deduced that $D^{ML}$ has a smaller Euclidean distance than $D^{HDD}$, as illustrated in FIG. 5. $R^H$ and $D^{HDD}$ always have different values at the position of the bit that is error corrected. In addition, since $D^{ML}$ and $D^{HDD}$ are different codewords, the minimum Hamming distance therebetween is d. It means that $D^{ML}$ and $R^H$ have different values at the minimum d−1 bits. Therefore, if the number of bits with different values between $D^{ML}$ and $R^H$ is d−1 and their positions are equal to the positions of d−1 LRBs, a squared Euclidean distance between $D^{ML}$ and $R^H$ has the minimum value. After calculating the squared Euclidean distances of $D^{ML}$ and $R^H$, respectively, the difference therebetween may be expressed by Equation 4 which will be described below.

If a case when the $D^{ML}$ has the smallest Euclidean distance is assumed to be a worst case, it means that d bits different from $D^{HDD}$ have a least reliability. Therefore, the difference of Euclidean distance between $D^{ML}$ and $R^H$ occurs due to existence of more than d−1 bits with different values therebetween and the worst case means that the different bits correspond to the LRB and is expressed by the following Equation 4.

$$\Sigma_{j=a(1),a(2),a(3)}\{(r_j-c_j)^2-(r_j-r_j^H)^2\}=4(|r_{a(1)}|\le|r_{a(2)}|\le|r_{a(3)}|) \qquad \text{[Equation 4]}$$

Here, a(1), a(2), and a(3) denote positions of d−1 bits with the least reliability and the reliability of each bit has a relationship of $|r_{a(1)}|\le|r_{a(2)}|\le|r_{a(3)}|$.

Through Equations 3 and 4, it is understood that the following Equation 5 needs to be satisfied in order to match $D^{HDD}$ and $D^{ML}$. That is, a condition in which $D^{HDD}$ is always smaller Euclidean distance than $D^{ML}$ may be derived as expressed in the following Equation 5.

$$|r_j|<|r_{a(1)}|+|r_{a(2)}|+|r_{a(3)}| \qquad \text{[Equation 5]}$$

Equation 5 maintains that the reliability of a j-th bit corrected by the HDD is smaller than a sum of reliabilities of d−1 bit positions to form the HDD at a correct error bit. Therefore, when j is equal to the bit position with a reliability of d−1 or less, the condition is always maintained. From this result, it is understood that the maximal number of LRBs to be compared with $d_j^{HDD}$ may be set to d−1, to ensure that the HDD has the same codeword as the SISO algorithm after decoding process.

Based on these two conditions, when the syndrome of the hard decision vector $R^H$ is detected as having a single error, the second decoder 150 performs the decoding of a row (column) vector of the m-th half iteration as follows:

When the syndrome indicates a single error, the second decoder 150 checks whether there a row (column) vector is detected as having a double error in an m−1-th half iteration. Thereafter, when no row (column) vector is detected as having a double error in the m−1-th half iteration, the second decoder 150 finds the optimal codeword $D^{HDD}=(d_1^{HDD}, d_2^{HDD}, \ldots, d_n^{HDD})$ through the HDD of the hard decision vector $R^H$ based on Condition 1.

Thereafter, the second decoder 150 computes the extrinsic information of a j-th bit using the following Equation 6.

$$w_j = \gamma_2 \cdot (2d_j^{HDD}-1), j=1,2,\ldots,n \quad \text{[Equation 6]}$$

Here, the reliability factor $\gamma_2$ may be 1.5 times the factor β of the related art. $\gamma_2$ is set to be slightly smaller than $\gamma_1$ because the error probability of the vector detected as having a single error is higher than that of the vector detected as having no error.

When a row (column) vector is detected as having a double error in an m−1-th half iteration, the second decoder 150 checks whether the bit corrected through the HDD of $R^H$ matches one of positions of d−1 LRBs based on Condition 2. If a match is found, the second decoder 150 obtains an optimal codeword $D^{HDD}$ according to Condition 1 and extrinsic information W using Equation 6. If no match is found, the second decoder 150 obtains the ML codeword $D^{ML}$ having the smallest Euclidean distance and the extrinsic information W by applying the Chase-Pyndiah decoding algorithm.

The second decoder 150 includes a double error check module 152 and decoding modules 154 and 156.

The double error check module 152 determines whether there is a double error in a previous half iterative decoding when it is detected as having a single error.

The decoding modules 154 and 156 perform HISO decoding or SISO decoding depending on whether there is a double error in the previous half iterative decoding.

The decoding modules 154 and 156 include a first decoding module 154 which performs the decoding procedure when there is a double error and a second decoding module 156 which performs the decoding procedure when there is no double error.

When there is no double error, the first decoding module 154 corrects the single error through the HISO decoding process before performing next iterative decoding. That is, when there is no double error determined in the previous half iteration, it means that a possibility of existence of double error from the next half iteration is low. Therefore, the first decoding module 154 obtains extrinsic information $w_j$ of a j-th bit based on the codeword D obtained through the error correction (hard decision decoding, HDD) of the extended Hamming code instead of the Chase-Pyndiah SISO decoding scheme having a high complexity of the related art. That is, the first decoding module 154 obtains the extrinsic information using Equation 6.

When there is a double error, the second decoding module 156 finds a position of a predetermined number (for example, three) of positions of least reliable bits (LRB) and compares the position of the LRB and a position of the single bit corrected through the HISO decoding. When two positions are the same, the second decoding module 156 uses the HISO decoding algorithm and when two positions are not the same, the second decoding module 156 obtains extrinsic information using the SISO decoding. When there is a double error determined in the previous half iteration, the second decoding module 156 compares the position of three least reliable bits (LRBs) which is one smaller than the least Euclidean distance $d_m$ of the extended Hamming code and a position of the single bit corrected through the error correction (hard decision decoding, HDD) of the extended Hamming code to determine whether the positions match. As the comparison result, if two positions match, the second decoding module 156 obtains j-th bit extrinsic information $W_j$ based on the codeword D obtained through the error correction (hard decision decoding, HDD) of the extended Hamming code. In this case, the second decoding module 156 obtains the extrinsic information using Equation 6. When two positions do not match, the second decoding module 156 obtains the extrinsic information through the Chase-Pyndiah SISO decoding algorithm of the related art. When the second decoding module 156 applies the SISO decoding algorithm, $2^P$ candidate codewords are generated by P LRB positions and duplicated or unnecessary codewords among $2^P$ candidate codewords are excluded and then the ML codeword is determined based on the smallest Euclidean distance.

The third decoder 160 obtains the ML codeword D and the extrinsic information W by applying the SISO decoding algorithm to the hard decision vector. That is, the syndrome operation indicates the double error, the third decoder 160 obtains the ML codeword D and the extrinsic information W using the Chase-Pyndiah algorithm.

As described above, when the hard decision vector $R^H$ is detected to have a double error and the single error, the SISO algorithm is applied. However, since the SISO algorithm of the related art needs to perform $2^P$ HDD during a process of generating $2^P$ candidate codewords from p LRBs, the decoding complexity is high. However, the decoding algorithm of the present disclosure reduces the number of codewords to be $2^{P-1}$ by excluding duplicated or unnecessary codewords from $2^P$ candidate codewords. By doing this, the number of HDDs use required in this process is reduced to half, so that the decoding complexity may be considerably reduced.

In the meantime, when the syndrome is detected as having a single error and a double error, a test pattern which is necessarily considered to create a valid codeword set is as represented in Tables 1 and 2.

TABLE 1

| Number of times 1 is included in the test pattern (all remaining bits are 0) | Number of test patterns |
|---|---|
| 0 | $\binom{p}{0}$ |
| 2 | $\binom{p}{2}$ |
| 4 | $\binom{p}{4}$ |
| ... | ... |
| p | $\binom{p}{p}$ |
| Total | $2^{P-1}$ |

TABLE 2

| Number of times 1 is included in the test pattern (all remaining bits are 0) | Number of test patterns |
|---|---|
| 1 | $\binom{p}{1}$ |
| 3 | $\binom{p}{3}$ |
| 5 | $\binom{p}{5}$ |
| ... | ... |
| p − 1 | $\binom{p}{p-1}$ |
| Total | $2^{p-1}$ |

In Tables 1 and 2, $$\binom{c}{b}$$

is a combination formula, which means the number of possible combinations of b objects included in a set of c objects. Test patterns which are not included in both Tables 1 and 2 may be removed by one of two reasons. That is, a test pattern which has the same sequence form as a valid codeword which can be created by the retained (included) test pattern or has a different vector form from the transmitted codeword $C_t$ may be removed and the performance loss therefor rarely occurs.

In order to confirm this, a portion which is not included when the syndrome of $R^H$ is detected as having a single error in Table 1 will be described.

First, a reason that a test pattern including a "1" is not included is as follows. First, when a bit including "1"s is the same as the error bit, the codeword generated after HDD is the same as the codeword obtained from the test pattern which does not include "1". However, when the bit including "1"s is not the same as the error bit, a codeword having a different form from the transmitted codeword $C_t$ may be generated. Likewise, the test pattern including "1"s in three positions is excluded because if all 3 bits including "1"s are error bits, the same codeword as that obtained from a test pattern including "1"s in four positions is obtained or if all 3 bits are not error bit, a wrong codeword may be created so that the above-mentioned two cases may be excluded.

Likewise, when the same criterion is applied to the case detected as having the double error, the result as represented in Table 2 may be obtained.

Figure 6:
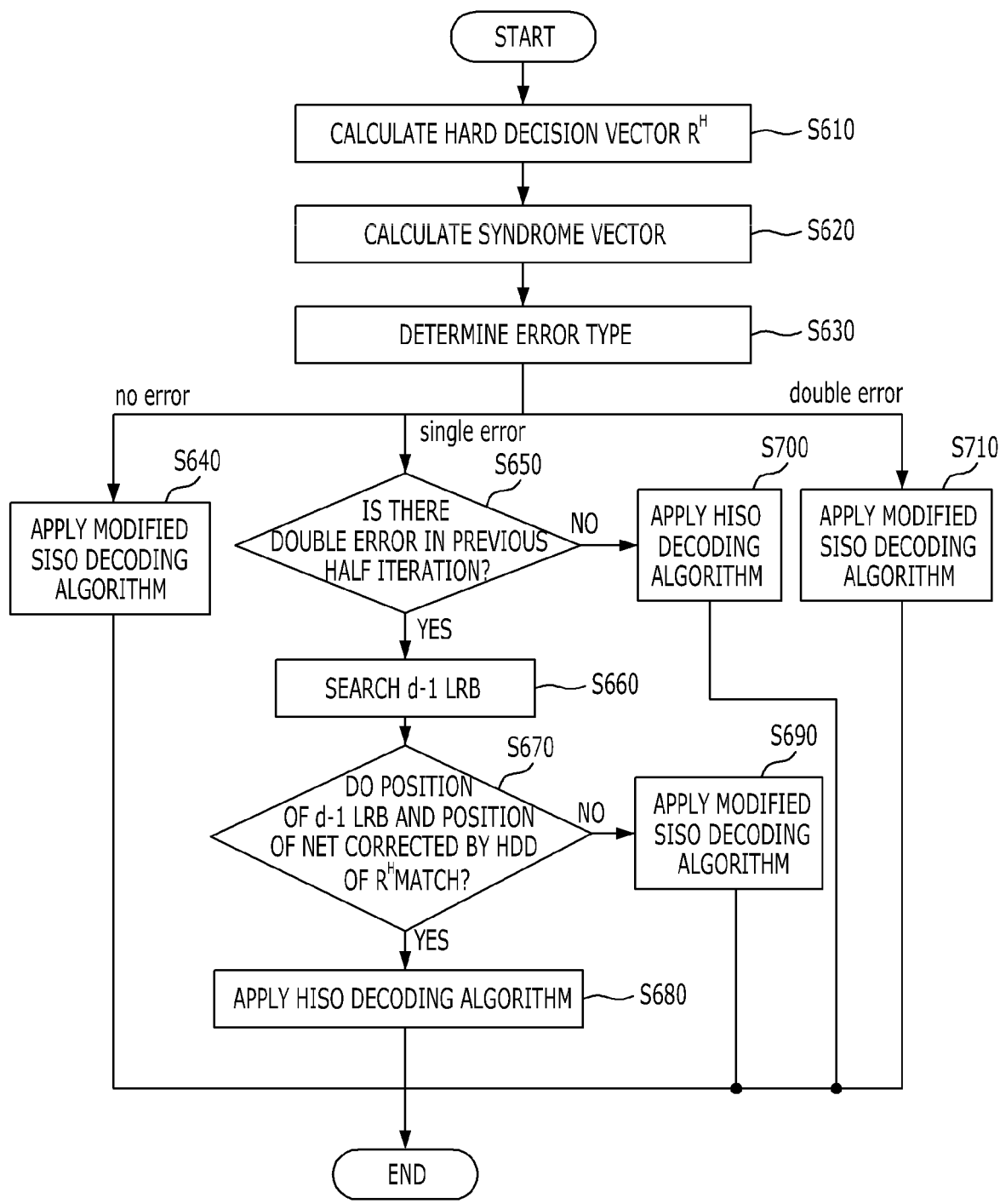
FIG. 6 is a view for explaining a low-complexity syndrome based decoding method according to an exemplary embodiment of the present disclosure.

FIG. 6 is a view for explaining a low-complexity syndrome based decoding method according to an exemplary embodiment of the present disclosure.

Referring to FIG. 6, the decoding apparatus performs hard decision on a current input value to calculate a hard decision vector in step S610.

After performing step S610, the decoding apparatus performs syndrome calculation on the hard decision vector in step S620 and determines an error type of the hard decision vector based on the syndrome calculation result in step S630. In this case, the decoding apparatus may determine the error type as at least one of no error, a single error, and a double error.

When the error type determined in step S630 is no error, the decoding apparatus performs the decoding procedure by applying a modified SISO decoding algorithm in step S640.

When the error type determined in step S630 is a single error, the decoding apparatus determines whether there is a double error in previous half iterative decoding in step S650.

As a determination result in step S650, when there is a double error, the decoding apparatus finds a position of a predetermined number (d−1) of least reliable bits (LRBs) in step S660 and compares the position of each LRB and a position of a single bit corrected through the HISO decoding to determine whether two positions match in step S670.

As a determination result of step S670, the decoding apparatus performs the decoding procedure using the HISO decoding algorithm in step S680 and when two positions do not match, performs the decoding procedure by applying a modified SISO decoding algorithm in step S690.

As a determination result of step S650, when there is no double error, the decoding apparatus corrects the single error through the HISO decoding algorithm before performing next iterative decoding in step S700.

When the error type determined in step S630 is a double error, the decoding apparatus performs the decoding procedure by applying a modified SISO decoding algorithm in step S710.

Hereinafter, the effect will be described by comparing the decoding algorithm of the present disclosure and the decoding algorithm of the related art.

First, the comparison will be made with respect to computational complexity.

Here, decoding complexities of a classical decoding algorithm and the algorithm of the present disclosure are compared based on the number of applications of the hard decision decoding (HDD) and the four primarily used operations (addition, multiplication, modulo 2, comparison).

The HDD based complexity is obtained by calculating the number of HDDs used in each algorithm, through the following Equation 7. In this case, it is assumed that the number of half iterations applied to the SISO decoding algorithm in the decoding algorithm of each $(n,k,d)^2$ BTC is $I_S$, the number of half iterations applied to the HIHO decoding algorithm is $I_H$, and the number of LRBs is p.

A number of HDDs $h_{cp}$ of the conventional Chase-Pyndiah algorithm is calculated as expressed in the following Equation 7.

$$h_{cp} = I_S \times n \times 2^p \qquad [\text{Equation 7}]$$

Next, the number of HDDs of the conventional hybrid decoding scheme that reduces the complexity by combining the SISO and HIHO algorithms is expressed by the following Equation 8.

$$h_{Hybrid} = \sum_{i=1}^{I_S}\{n \times [R_e^i \times 1 + (1 - R_e^i) \times 2^p]\} + I_H \times n \qquad [\text{Equation 8}]$$

Here, $R_e^i$ denotes a ratio of a number of bits having different values which is smaller than a threshold value δ when a hard decision sequence of n input vectors and a sequence after HDD are compared in an i-th half iteration.

In the syndrome based decoding algorithm, the complexity is reduced by a ratio $R^i_{zero}$ detected as a zero syndrome in an i-th half iteration and the number of HDDs h, obeys the following Equation 9.

$$h_s = \sum_{i=1}^{l_s} [n \times (1 - R^i_{zero}) \times 2^p] \qquad \text{[Equation 9]}$$

Finally, the total number $h_p$ of HDD operations of the algorithm proposed in the present disclosure may be expressed by the following Equation 10 using a ratio $\lambda^i_d$ of vectors detected as having a double error among n input row vectors in an i-th iteration, a ratio $\lambda^i_s$ of vectors decoded using the SISO algorithm in Condition 2, and a sum $\lambda^i_H$ of ratios of the parts to which HDD is applied in Conditions 1 and 2.

$$h_p = \sum_{i=1}^{l_s} \{n \times [(\lambda^i_d + \lambda^i_s) \times 2^{p-1} + \lambda^i_H]\} \qquad \text{[Equation 10]}$$

In order to compare how much the complexity of the algorithm is reduced as compared with the Chase-Pyndiah algorithm based on the number of uses of HDD in each decoding algorithm, the following Equation 11 is applied.

$$R_H = \frac{h_i}{l_s \times n \times 2^p} \qquad \text{[Equation 11]}$$

Here, $h_i$ denotes the number of HDDs in i decoding algorithm.

Figure 7:
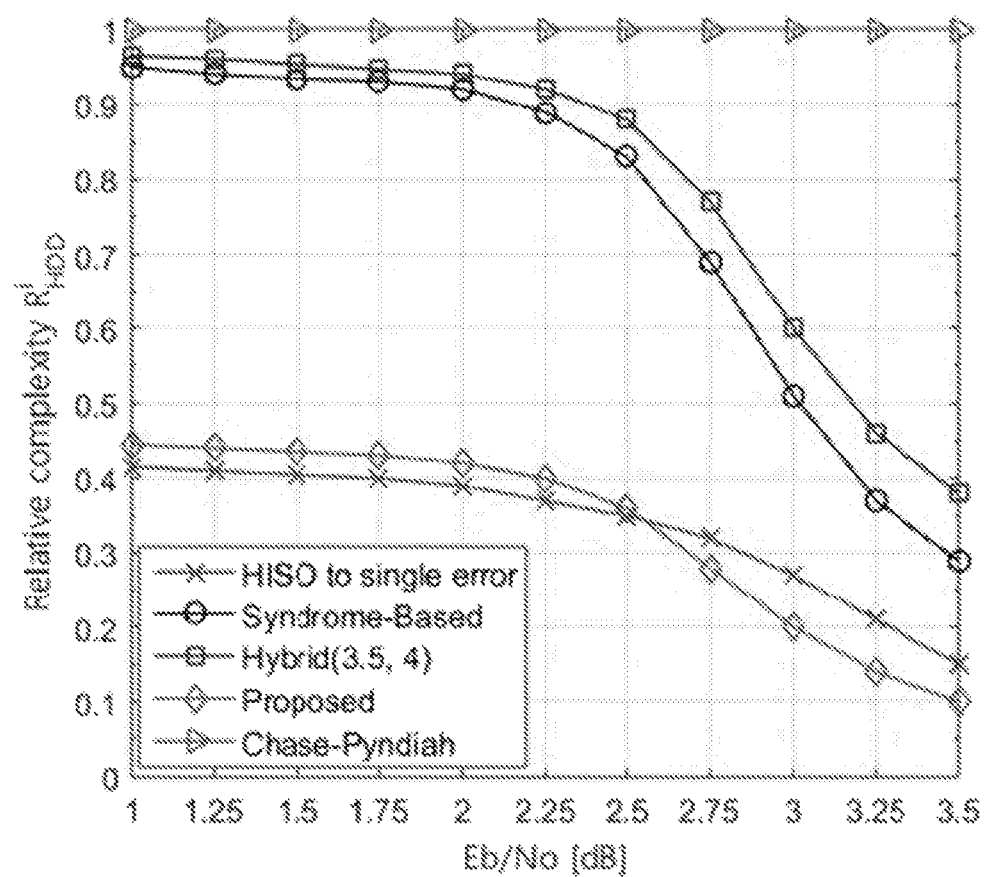
FIG. 7 is a view for comparing complexity reducing effects of the present disclosure applied to (64, 57, 4) BTC according to an exemplary embodiment of the present disclosure and a technique of the related art.
Figure 8:
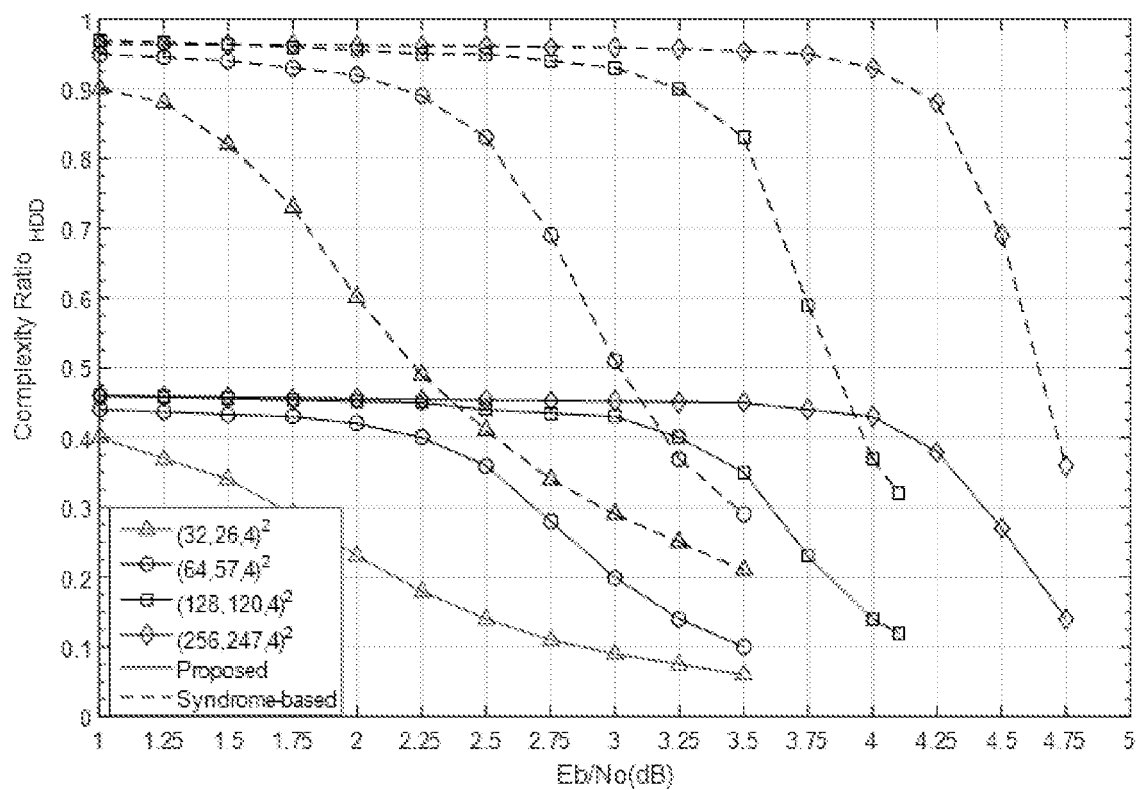
FIG. 8 is an exemplary view for comparing the complexities in four decoding rates in accordance with an SNR in the present disclosure and the related art decoding scheme.
Figure 9:
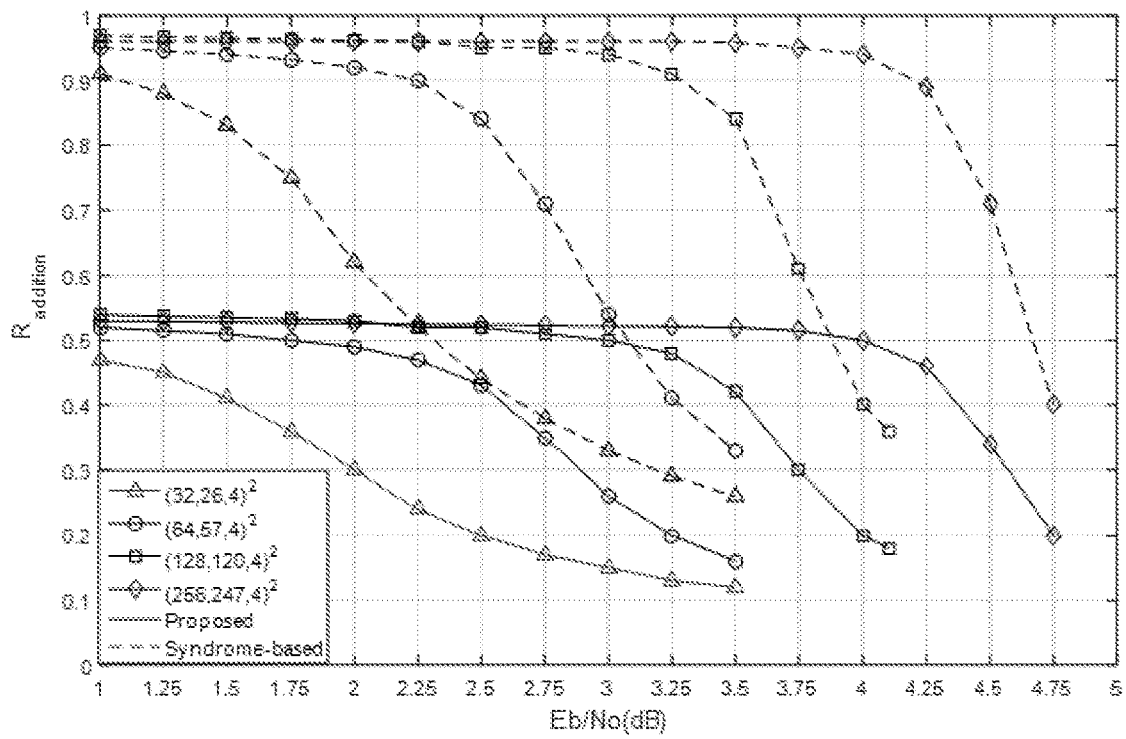
FIG. 9 is a view for comparing relative complexities in $L_1$.
Figure 10:
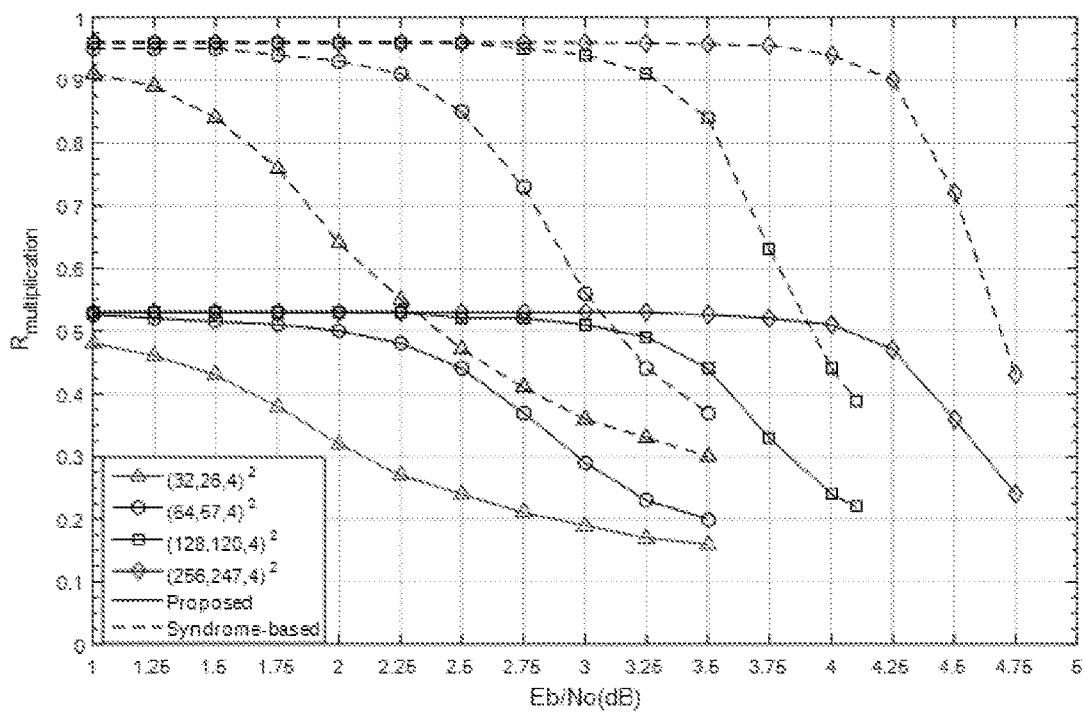
FIG. 10 is a view for comparing relative complexities in $L_2$.
Figure 11:
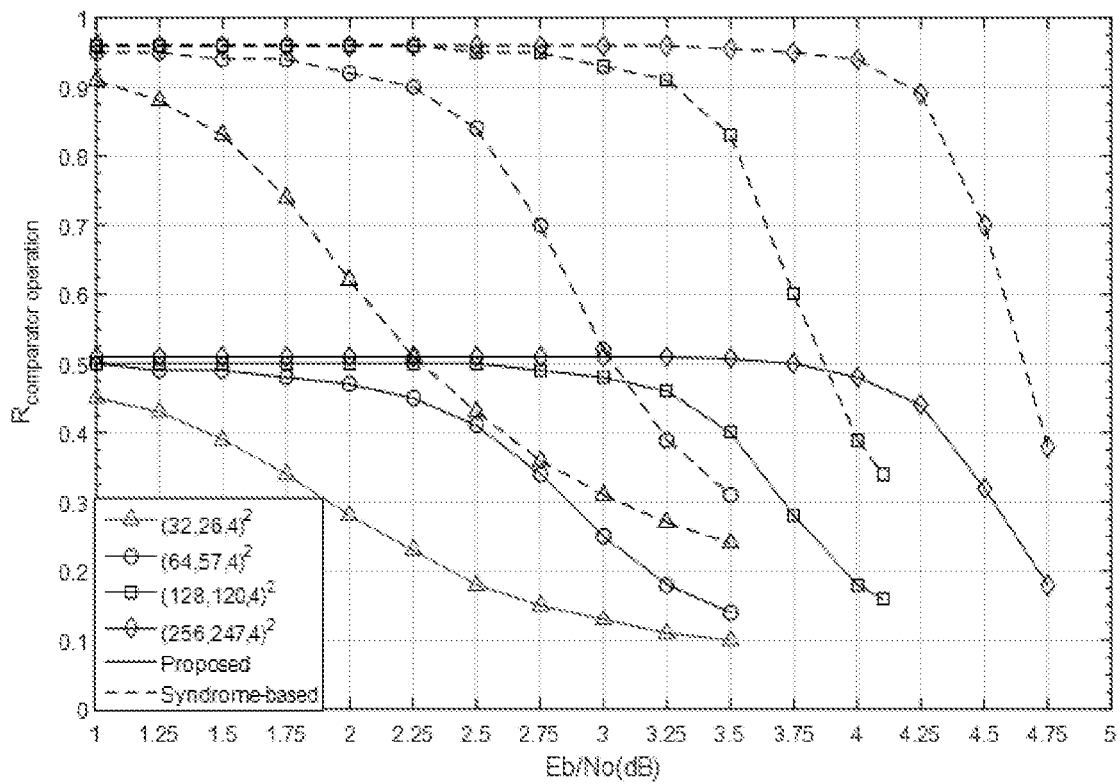
FIG. 11 is a view for comparing relative complexities in $L_3$.
Figure 12:
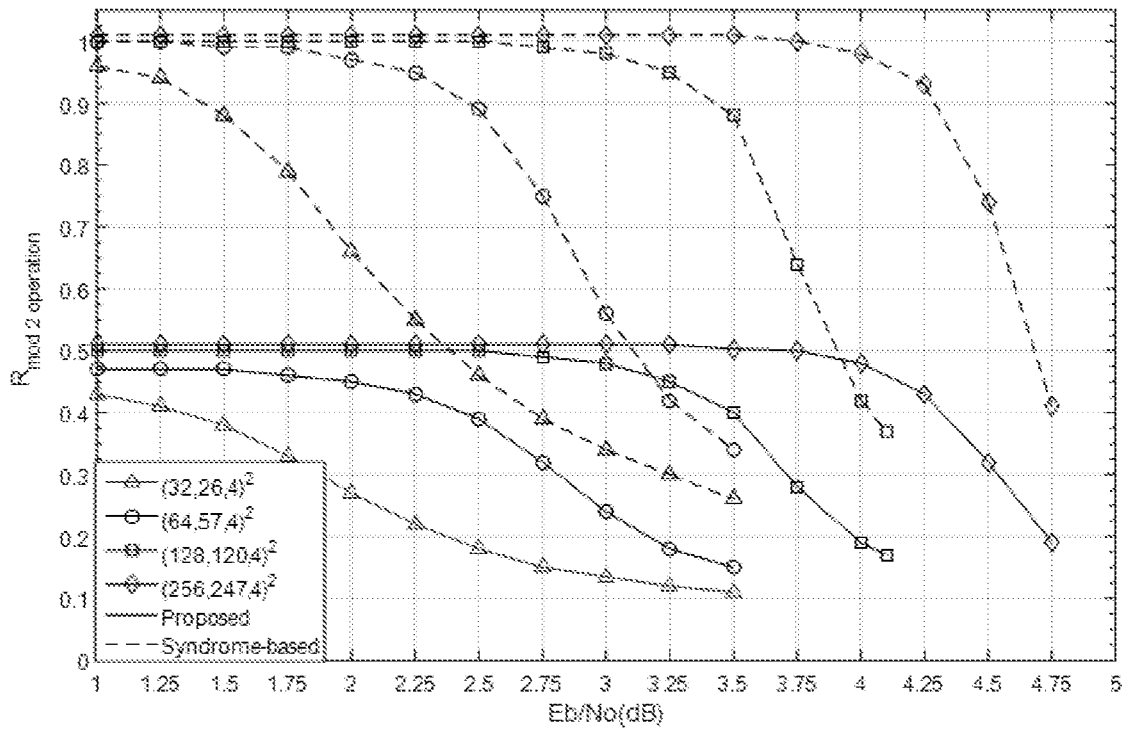
FIG. 12 is a view for comparing relative complexities in $L_4$.

In FIGS. 7 and 8, $I_s$ and p are set to be 8 and 4 in the BTC, respectively and then a relative reduction rate $R_H$ of the HDD usage is compared in various algorithms described in the present disclosure.

First, FIG. 7 illustrates a relative HDD reduction rate when the proposed algorithm and three classical algorithms are applied to $(64,57,4)^2$ BTC according to Eb/No. It is understood that as the signal to noise ratio (SNR) increases, the complexity of the Chase-Pyndiah algorithm remains constant, but the number of used HDDs is gradually reduced in other algorithms. Specifically, as compared with Chase-Pyndiah, Hybrid and syndrome based algorithms at an SNR of 3.5 dB, the proposed algorithm may reduce the HDD computation by 90%, 73%, and 66%. Here, the hybrid (3.5, 4) means a decoding algorithm in which 3.5 SISO algorithms and four HIHO algorithms are combined in an iterative decoding process and Max. HDD means that among syndromes of the received hard decision vector $R^H$, only the HDD is applied to decode all cases detected as having no error and a single error. However, the performance degrades considerably, as seen in a BER performance described below. Therefore, it is understood that as compared with the proposed algorithm, a ratio detected as having a double error is significantly high so that the relative HDD reduction ratio may be similar or smaller than that according to the SNR.

FIG. 8 compares relative HDD reduction rate of the syndrome based algorithm having the greatest reduction effect of the number of HDDs among the methods of the related art and the proposed algorithm as a two-dimensional BTC decoding scheme based on the (32,26,7), (64,57,4), (128,120,4), (256,247,4) extended Hamming code. By doing this, it is understood that the proposed algorithm is efficient for reducing the HDD usage amount to less than half compared with the algorithm of the related art in all four cases regardless of the SNR.

Next, the decoding complexity for m half iteration processes is analyzed based on the number of times in which four mainly used operations are used. To this end, the number of times each operation is used during one decoding process among n input row (column) vectors is defined as follows:

Number of used addition operations: $L_1$
Number of used multiplication operations: $L_2$
Number of used comparison operations: $L_3$
Number of used modulo 2 operations: $L_4$ In order to compare the complexities of four operations in the Chase-Pyndiah, the syndrome based algorithm, and the proposed algorithm, the number of uses per operation in each algorithm is calculated. First, the number of uses of the operation per step of the Chase-Pyndiah algorithm is as represented in the following Table 3.

TABLE 3

| Step | Addition | Multiplication | Comparison | Mod 2 |
|---|---|---|---|---|
| 1 | | | n − 1 | |
| 2 | | n | (p + 1)n − p | |
| 3 | | | | p · $2^p$ |
| 4 | | | | (n − 1)$2^p$ |
| 5 | | | $2^{p+1}$ | $(n^2 − (n − 1)(1 + k)]2^p$ |
| 6 | n · $2^p$ | n · $2^p$ | | |
| 7 | | | $2^p$ − 1 | |
| 8 | 2n | 2n | 2n($2^p$ − 1) | |
| $L_c^1$ | n($2^p$ + 2) | n($2^p$ + 3) | (2n + 3)$2^p$ + p(n − 1) − 2 | $[n^2 − (n − 1)k + p]2^p$ |

The total number of uses per operation after m half iterations is calculated by multiplying the number of uses of one row vector by mn.

Next, the number of uses per operation of the syndrome based algorithm is represented by Tables 4 and 5 which represent a usage amount per step when the syndrome is no error and a single error.

TABLE 4

| Step | Addition | Multiplication | Comparison | Mod 2 |
|---|---|---|---|---|
| 1 | | | n − 1 | (n − 1 − k)(n − 1) |
| 2 | | | n − 1 − k | |
| 3 | n | 2n | | |
| $L_c^{2, zero}$ | n | 2n | 2(n − 1) − k | (n − 1 − k)(n − 1) |

TABLE 5

| Step | Addition | Multiplication | Comparison | Mod 2 |
|---|---|---|---|---|
| 1 | | | n − 1 | (n − 1 − k)(n − 1) |
| 2 | n · $2^p$ | n($2^p$ + 1) | 3 · $2^p$ + (2 + p)(n − 1) − k | $2^p(p + n^2 − kn + k)$ |

TABLE 5-continued

| Step | Addition | Multiplication | Comparison | Mod 2 |
|---|---|---|---|---|
| 3 | 2n | 2n | $2n(2^P - 1)$ | |
| $L_c^{2, nonzero}$ | $n(2^P + 2)$ | $n(2^P + 3)$ | $(2n + 3)2^P + (p + 1)(n - 1) - 2 - k$ | $2^P(p + n^2 - kn + k) + (n - 1 - k)(n - 1)$ |

In this case, the total number of uses of the operator after m half iterations is calculated by adding all the values obtained by calculating a weight of input vectors having a zero syndrome and not among n input vectors per iteration and multiplying the weight and the usage amount of an operator required to decode one row vector.

Finally, the complexities of the decoding algorithm of the present disclosure for four operations may be classified into five cases based on the syndrome or Conditions 1 and 2 and the number of uses per operation is represented in the following Table 6.

TABLE 6

| Case | Addition | Multiplication | Comparison | Mod 2 |
|---|---|---|---|---|
| No error, $L_c^{3, 1}$ | n | 2n | 2n − k | (n − k)n |
| Single error $L_c^{3, 2}$ (condition 1 match) | 2n | 2n | 2n − k + 3 | (n − k + 1)n |
| Single error $L_c^{3, 3}$ (condition 2 match) | 2n | 3n | 6n − k + 3 | (n − k + 1)n |
| Single error $L_c^{3, 4}$ (condition 2 does not match) | $n(2^{p-1} + 3)$ | $n(2^{p-1} + 3)$ | $2^{p-1}(2n + 3) + n(1 + p) − p − k + 5$ | $(n − k + 1)n + 2^{p-1}(n^2 − kn + k + p)$ |
| Double error $L_c^{3, 5}$ | $n(2^{p-1} + 2)$ | $n(2^{p-1} + 3)$ | $(2n + 3)2^{p-1} + p(n − 1)$ | $(n − k)n + 2^{p-1}\{n(n − k) + k + p\}$ |

When the rate accounted for each of five cases in an i-th (m≥i) half iteration is assumed as $\varphi_1^i \sim \varphi_5^i$ from the top of Table 6, the total usage among $C_t^m$ of $L_t$ (t=1, 2, 3, 4) operations after the m-th half iteration may be expressed by the following Equation 12.

$$C_t^m = \sum_{i=1}^{m} n\left(\sum_{c=1}^{5} \varphi_c^i \times L_t\right) \quad \text{[Equation 12]}$$

The relative complexity per operation under the same condition as the complexity of the HDD is represented based on the number of operations of the Chase-Pyndiah algorithm, the results are illustrated in FIGS. 9 to 12.

Referring to FIGS. 9 to 12, it shows that the proposed algorithm commonly has a considerably low complexity in all four operations as compared with the syndrome based algorithm in the BTC configured by component codes having four different lengths. Specifically, it is understood that the present disclosure has the greatest effect on improving complexity in terms of comparison operation as compared with the other three operations, among four operations. Finally, in the present disclosure having (32, 26, 4) extended Hamming code as a component code for 3.5 dB, the complexity of the comparator operation is 10 times lower than that of the Chase-Pyndiah and 2.4 times lower than that of the syndrome-based algorithm.

Next, the complexity is compared based on the BER performance.

In order to evaluate the performance, the BTC with extended Hamming code specified in the IEEE 802.16 standard is used. For the experiment, the number of LRBs is limited to four and the number of iterations is limited to four. Further, as a weight factor used for the m-th iterative decoding process, α(m)={0, 0.2, 0.3, 0.5, 0.7, 0.9, 1} and β(m)={0.2, 0.4, 0.6, 0.8, 1, 1, 1, 1} were used. The reliability factor $\gamma_1$ used for a no error case was twice the value of β and the reliability value $\gamma_2$ used for a single error case was 1.5 times of the value of β. The performance analysis was commonly performed under the AWGN and BPSK modulation.

Figure 13:
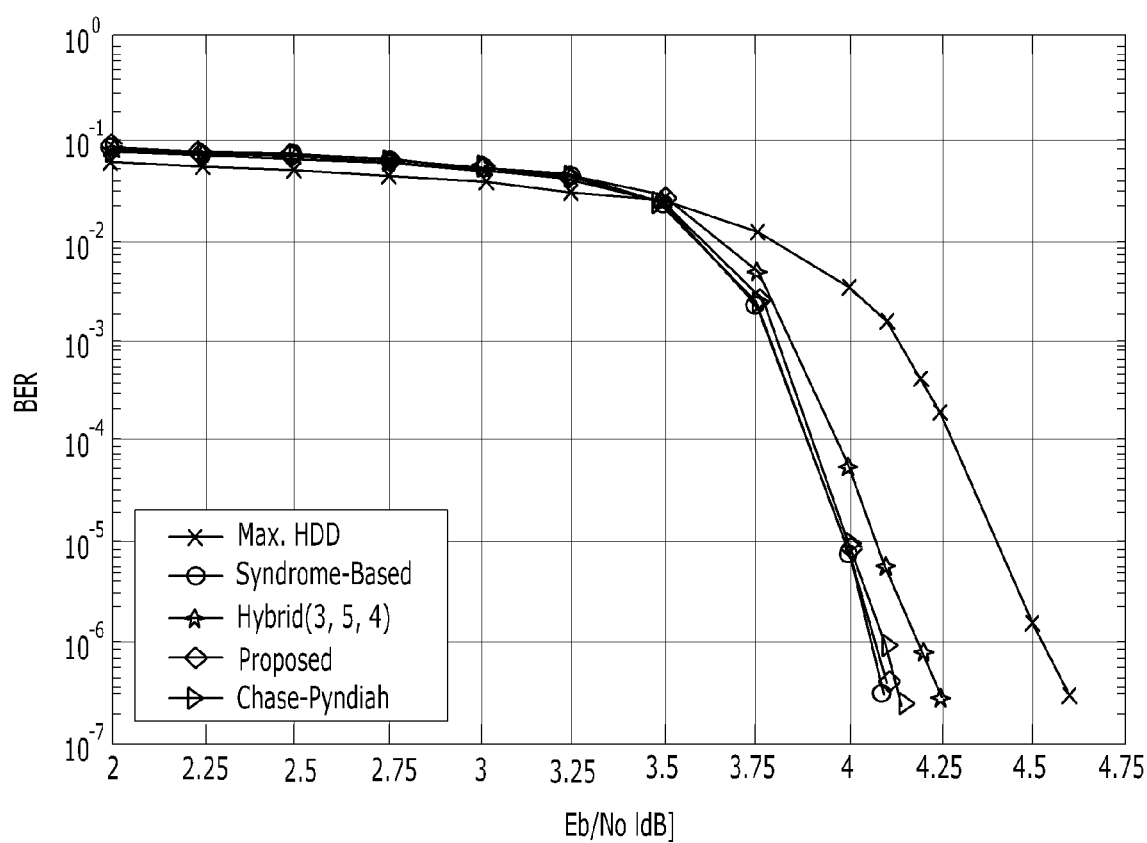
FIG. 13 is a view for comparing a BER performance in $(128,120,4)^2$ BTC.

FIG. 13 illustrates the BER performance obtained after applying the proposed algorithm and two conventional algorithms to the BTC having (32,26,4), (64,57,4), (128,120,4), and (256,247,4) extended Hamming codes as component codes. In this case, the reliability factor γ applied to the conventional syndrome based algorithm is twice the value of β(m) which is the same as the proposed algorithm for the equal comparison.

The experimental result based thereon reveals that the present disclosure having a low complexity exhibits nearly the same BER performance as the conventional algorithms. Further, it is understood that as the length of the component code increases, the proposed algorithm has better performance than that of the conventional Chase-Pyndiah algorithm. When the extrinsic information is calculated from the Chase-Pyndiah algorithm, the maximum number of bits in which the candidate codeword is located is fixed to $2^P + p + 1$ obtained by adding positions of $2^P$ bits, positions of p LRB, and a position of an extended bit. Therefore, the rate of using extrinsic information when a candidate codeword does not exist that as the length of the component code increases, the accuracy is lowered increases so that the performance of the Chase-Pyndiah algorithm is degraded as compared with the other algorithms as the length of the component code increases.

Figure 14:
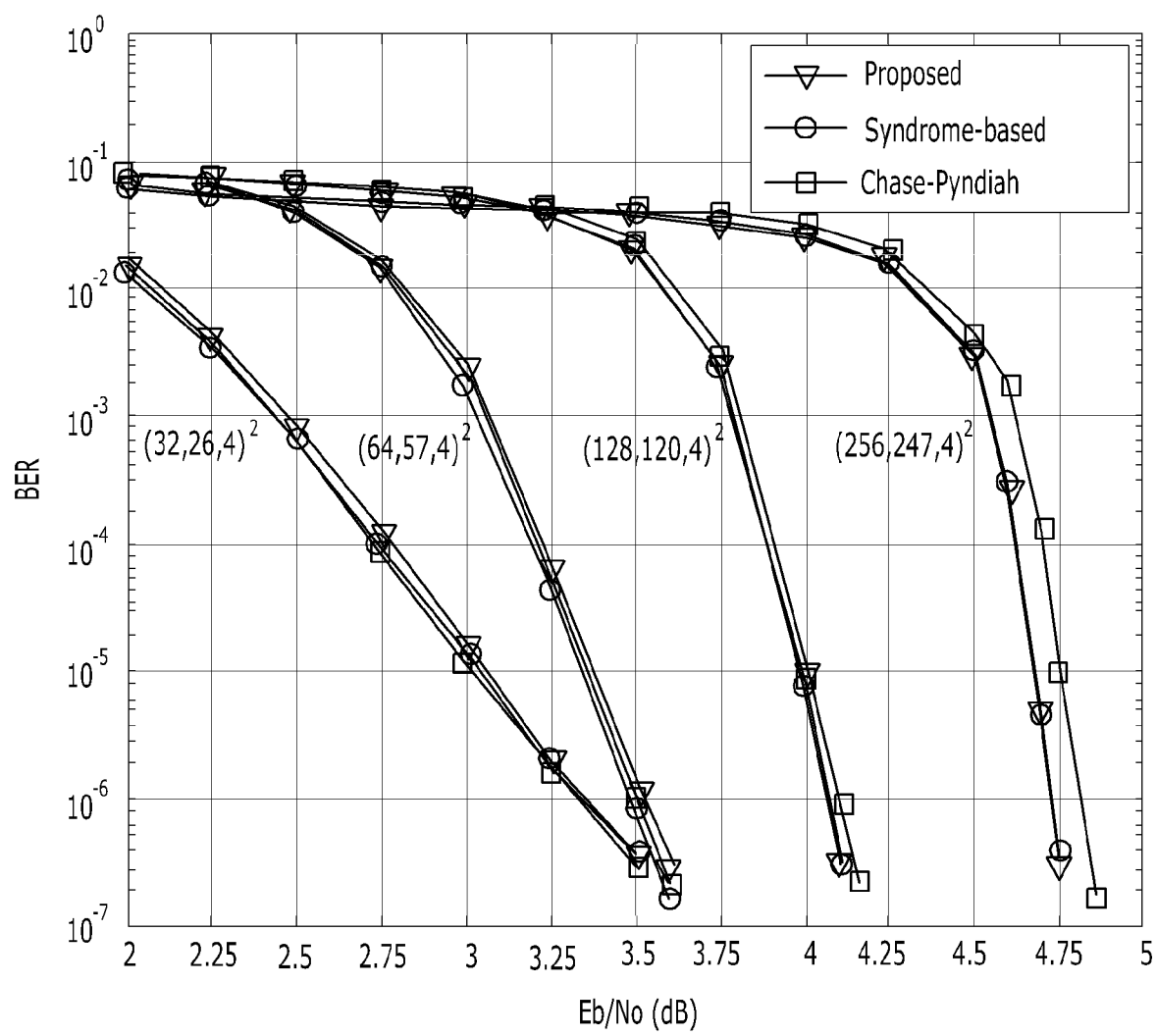
FIG. 14 is a view for comparing BER performances of the BTC of the present disclosure and the related art at various code rates.

FIG. 14 compares the performances of the proposed algorithm and four other decoding algorithms in the $(128, 120, 4)^2$ BTC. The other four algorithms other than the proposed algorithm are the same schemes as introduced in the complexity part. Through the performance comparison, it is confirmed that four algorithms excluding Max. HDD exhibit nearly the same performance. Further, the performance loss of the Max. HDD occurs because the HDD is performed to all the parts detected as having a single error and the reason is as follows: Some of hard decision vectors detected as having a single error may include more errors than one bit. In this case, when the HDD is performed, the error correction may be performed in the position of the wrong bit, which results in the loss of performance. In order to solve this problem, the proposed algorithm applies two conditions and thus it is understood that the BER performance which is nearly the same as the syndrome based algorithm having the best performance is obtained from the simulation result.

In the meantime, the present disclosure applies the low complexity HDD based HISO algorithm as a decoding scheme of an input vector estimated to have a single error by utilizing a characteristic that the extended Hamming code syndrome detects the input vector as three types of error in order to improve the decoding complexity. However, when the HDD is applied to all input vectors detected as having a single error, the performance loss may occur due to some input vectors having multiple error. In order to solve this problem, among input vectors detected as having a single error, two conditions which classify a case with a single error and a case with a multiple error are sequentially applied and the SISO algorithm and the HISO algorithm are separately applied depending on whether to satisfy the conditions so that the number of uses of the SISO algorithm may be reduced without performance loss.

Further, the Chase-Pyndiah algorithm is applied to some of non-zero syndrome which cannot be decoded by the HISO algorithm and the number of applications of HDD is reduced to half by eliminating half the codewords which are duplicated or unnecessary among $2^p$ candidate codewords which are considered during this process. By doing this, it is understood that the present disclosure is efficient decoding algorithm which greatly improves the decoding complexity without performance degradation as compared with the decoding algorithm of the related art.

The referenced drawings and described detailed description of the present invention are exemplary of the present disclosure, which are used for the purpose of merely describing the present invention, not limiting the scope of the present disclosure which is included in the appended claims. Therefore, it will be appreciated to those skilled in the art that various modifications are made and other equivalent embodiments are available. Accordingly, the actual scope of the present disclosure must be determined by the spirit of the appended claims.

What is claimed is:

1. A low-complexity syndrome based decoding apparatus, comprising:
a hard decision unit which performs hard decision on a current input value to output a hard decision vector;
a syndrome calculator which performs a syndrome operation on the hard decision vector and determines an error type of the hard decision vector based on the syndrome operation result; and
a decoder which selects a predetermined decoding algorithm in accordance with the error type to perform the decoding, wherein the error type includes at least one of no error, a single error, and a double error,
wherein the decoder performs a decoding procedure by applying different decoding algorithms when the error type is no error, the single error or the double error, and
wherein the decoder includes:
a first decoder which performs a decoding procedure by applying a soft input soft output (SISO) decoding algorithm when the error type is no error;
a second decoder which performs a decoding procedure by applying a hard input soft output (HISO) decoding algorithm or a modified SISO decoding algorithm depending on whether there is a double error in previous half iterative decoding when the error type is the single error; and
a third decoder which performs a decoding procedure by applying a modified SISO decoding algorithm when the error type is the double error.

2. The low-complexity syndrome based decoding apparatus according to claim 1, wherein the current input value is a received signal value which means received signal information which passes through a channel.

3. The low-complexity syndrome based decoding apparatus according to claim 1, wherein the syndrome calculator calculates a syndrome vector by multiplying the hard decision vector and a predetermined parity check matrix and determines at least one error type among the no error, the single error, and the double error for the hard decision vector, based on the syndrome vector.

4. The low-complexity syndrome based decoding apparatus according to claim 1, wherein the first decoder selects the hard decision vector as a codeword and calculates extrinsic information based on the hard decision vector.

5. The low-complexity syndrome based decoding apparatus according to claim 1, wherein the second decoder includes:
a double error check module which determines whether there is the double error in previous half iterative decoding; and
a decoding module which performs the HISO decoding algorithm or the modified SISO decoding algorithm depending on whether there is the double error as a determination result of the double error check module.

6. The low-complexity syndrome based decoding apparatus according to claim 5, wherein the decoding module includes:
a first decoding module which corrects the single error through the HISO decoding algorithm before performing next iterative decoding when there is no double error; and
a second decoding module which finds a position of a predetermined number of least reliable bits (LRBs) when there is the double error, uses the HISO decoding algorithm when the position of the LRB and the position of a single bit corrected by the HISO decoding are compared and the positions are the same, and uses the modified SISO decoding algorithm when the two positions are not the same.

7. The low-complexity syndrome based decoding apparatus according to claim 1, wherein the modified SISO decoding algorithm generates $2^p$ candidate codewords by the positions of P (p is a natural number) of least reliable bits (LRBs) and eliminates duplicated or unnecessary codewords among the candidate codewords, and then determines a maximum likelihood codeword by calculating the least Euclidean distance.

8. A low-complexity syndrome based decoding method by a decoding apparatus, the method comprising:
performing hard decision on a current input value to output a hard decision vector;
performing a syndrome operation on the hard decision vector and determining an error type of the hard decision vector based on the syndrome operation result; and
performing the decoding by selecting a predetermined decoding algorithm in accordance with the error type, wherein the error type includes at least one of no error, a single error, and a double error, and wherein in the performing of the decoding:
    when the error type is no error, a soft input soft output (SISO) decoding algorithm is applied to perform the decoding;
    when the error type is the single error, a hard input soft output (HISO) decoding algorithm or a modified SISO decoding algorithm is applied to perform the decoding, depending on whether there is a double error in previous half iterative decoding; and
    when the error type is the double error, a modified SISO decoding algorithm is applied to perform the decoding.

9. The low-complexity syndrome based decoding method according to claim 8, wherein the determining of an error type includes:
    calculating a syndrome vector by multiplying the hard decision vector and a predetermined parity check matrix; and
    determining at least one error type among the no error, the single error, and the double error for the hard decision vector, based on the syndrome vector.

10. The low-complexity syndrome based decoding method according to claim 8, wherein in the performing of the decoding, when the error type is no error, an SISO decoding algorithm is applied to perform the decoding procedure.

11. The low-complexity syndrome based decoding method according to claim 8, wherein the performing of the decoding, includes: when the error type is a single error,
    determining whether there is the double error in previous half iterative decoding;
    correcting the single error through the HISO decoding algorithm before performing next iterative decoding when there is no double error; and
    finding a position of a predetermined number of least reliable bits (LRBs) when there is the double error, using the HISO decoding algorithm when the position of the LRB and the position of the single bit corrected by the HISO decoding are compared and the positions are the same, and using the modified SISO decoding algorithm when the two positions are not the same.

12. The low-complexity syndrome based decoding method according to claim 8, wherein in the performing of the decoding: when the error type is the double error, the modified SISO decoding algorithm is applied to perform the decoding procedure.

* * * * *